Feb. 16, 1965 W. J. MULDOON 3,170,105

COMMUTATING FILTER FOR INDUCTIVE LOAD

Filed April 16, 1963 3 Sheets-Sheet 1

INVENTOR.
WILLIAM J. MULDOON,
BY Paul M. Coble
ATTORNEY.

Feb. 16, 1965 W. J. MULDOON 3,170,105

COMMUTATING FILTER FOR INDUCTIVE LOAD

Filed April 16, 1963 3 Sheets-Sheet 2

INVENTOR.
WILLIAM J. MULDOON,
BY Paul M. Coble
ATTORNEY.

Feb. 16, 1965 W. J. MULDOON 3,170,105

COMMUTATING FILTER FOR INDUCTIVE LOAD

Filed April 16, 1963 3 Sheets-Sheet 3

INVENTOR.
WILLIAM J. MULDOON,
BY Paul M. Coble
ATTORNEY.

United States Patent Office 3,170,105

Patented Feb. 16, 1965

3,170,105

COMMUTATING FILTER FOR INDUCTIVE LOAD

William J. Muldoon, Palos Verdes, Calif., assignor to Hughes Aircraft Company, Culver City, Calif., a corporation of Delaware Filed Apr. 16, 1963, Ser. No. 273,405
15 Claims. (Cl. 318—341)

Figure 1:
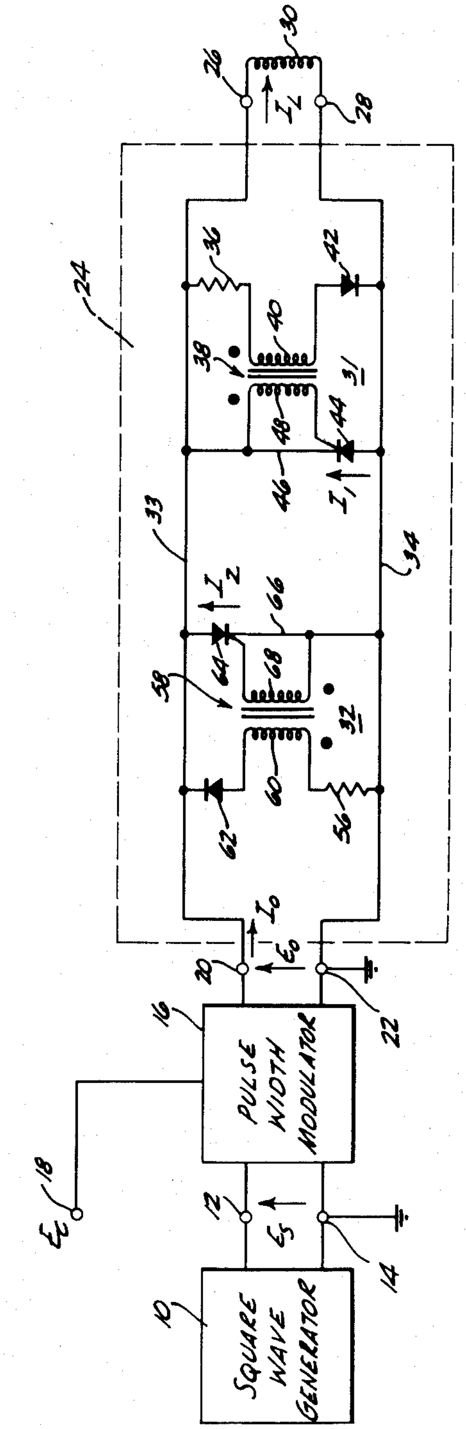

This invention relates to filter networks, and more particularly relates to a highly efficient commutating filter for smoothing current to be applied to an inductive load.

The design of motor control systems for use in mobile equipment, and in particular in airborne vehicles, places a high premium on the size, weight, power efficiency, and reliability of the control system. Advances in the development of semiconductors have made possible substantial reductions in the size and weight of control amplifiers. However, there remains a need to improve the power efficiency and reliability of such control systems, and it is toward the accomplishment of this objective that the present invention is directed.

More specifically, it is an object of the present invention to provide a filter for use in a motor control system which not only achieves a vast reduction in power dissipation, but which also is smaller and lighter than prior art filters employed in such systems.

It is a further object of the present invention to provide an efficient filter for smoothing current to an inductive load which does not require tuning with the load so that the same filter may be used with loads having a wide range of inductance values, permitting a greater degree of standardization and fewer spare parts for field service.

It is a still further object of the present invention to provide a commutating filter for providing current to an inductive load which may be driven from a pulse width modulated carrier, the modulating signal being either a reversible polarity D.C. voltage or a low frequency A.C. voltage.

In accordance with the foregoing objects, the filter circuit of the present invention includes first and second terminals for coupling to an inductive load. A diode rectifier and the primary winding of a transformer are coupled in series between the first and second terminals. A controlled rectifier, preferably a silicon controlled rectifier, has its current path coupled between the first and second terminals in parallel with the diode rectifier and transformer primary and in opposite unidirectional conductivity to that of the diode rectifier. The control electrode of the controlled rectifier is coupled to the secondary winding of the transformer.

By coupling a pair of the above-described filter arrangements across the inductive load in opposite directional conductivities, a commutating filter may be provided. The commutating filter may be driven by a reversible polarity pulse train, pulse width modulated by either a reversible polarity direct voltage or by a low frequency alternating voltage. In the former case, the circuit finds application in controlling a D.C. shunt motor having a reversible direction of rotation, while in the latter case, the filter may be used to control an A.C. shunt motor.

Figure 3:
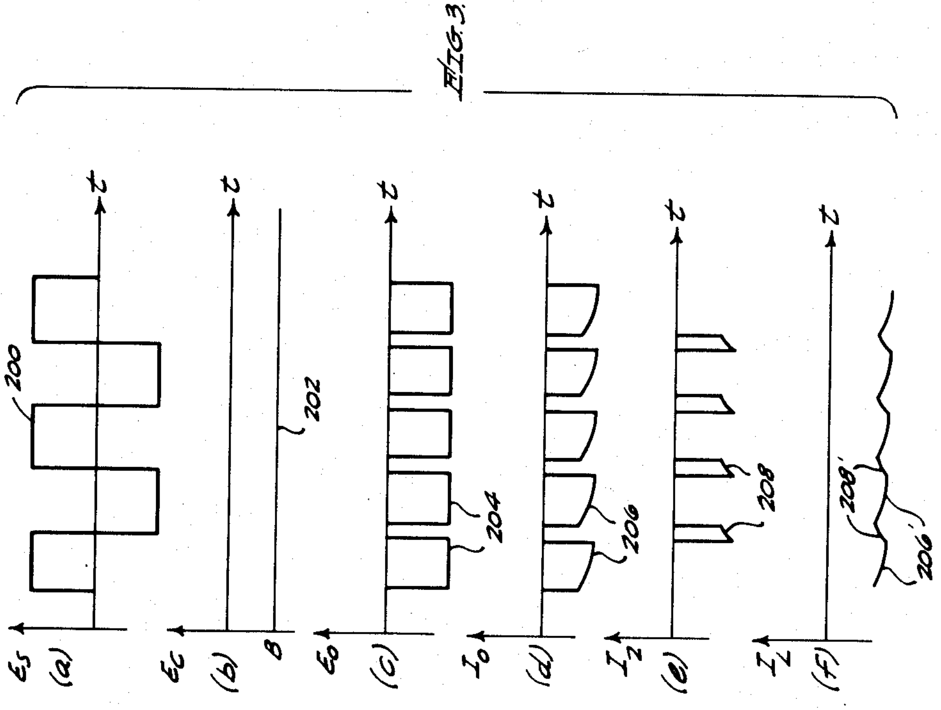
Figure 2:
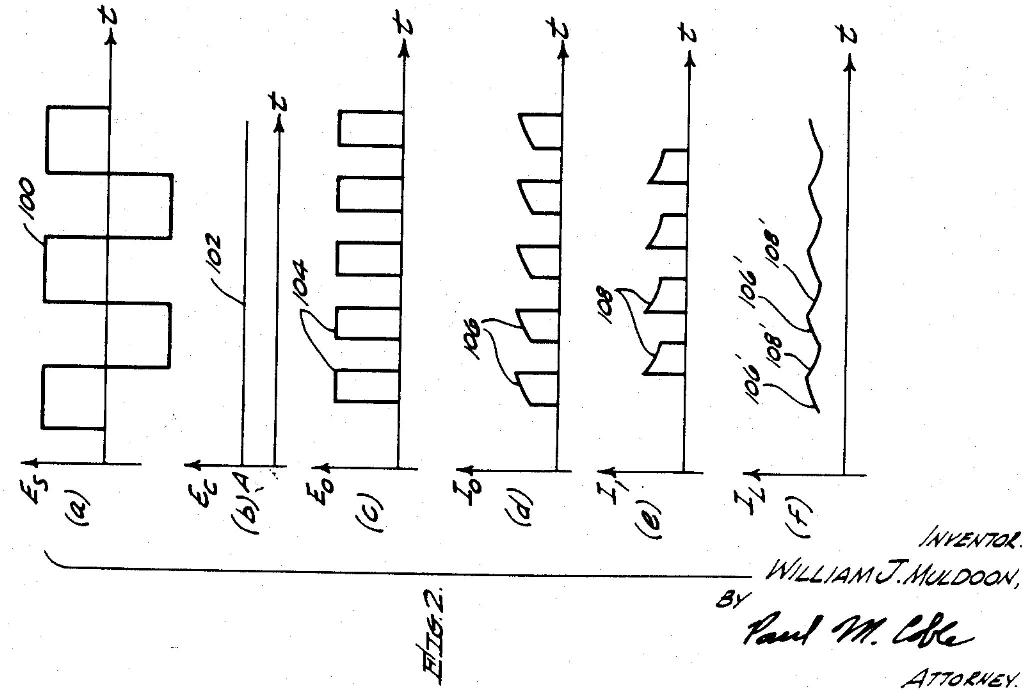
Figure 4:
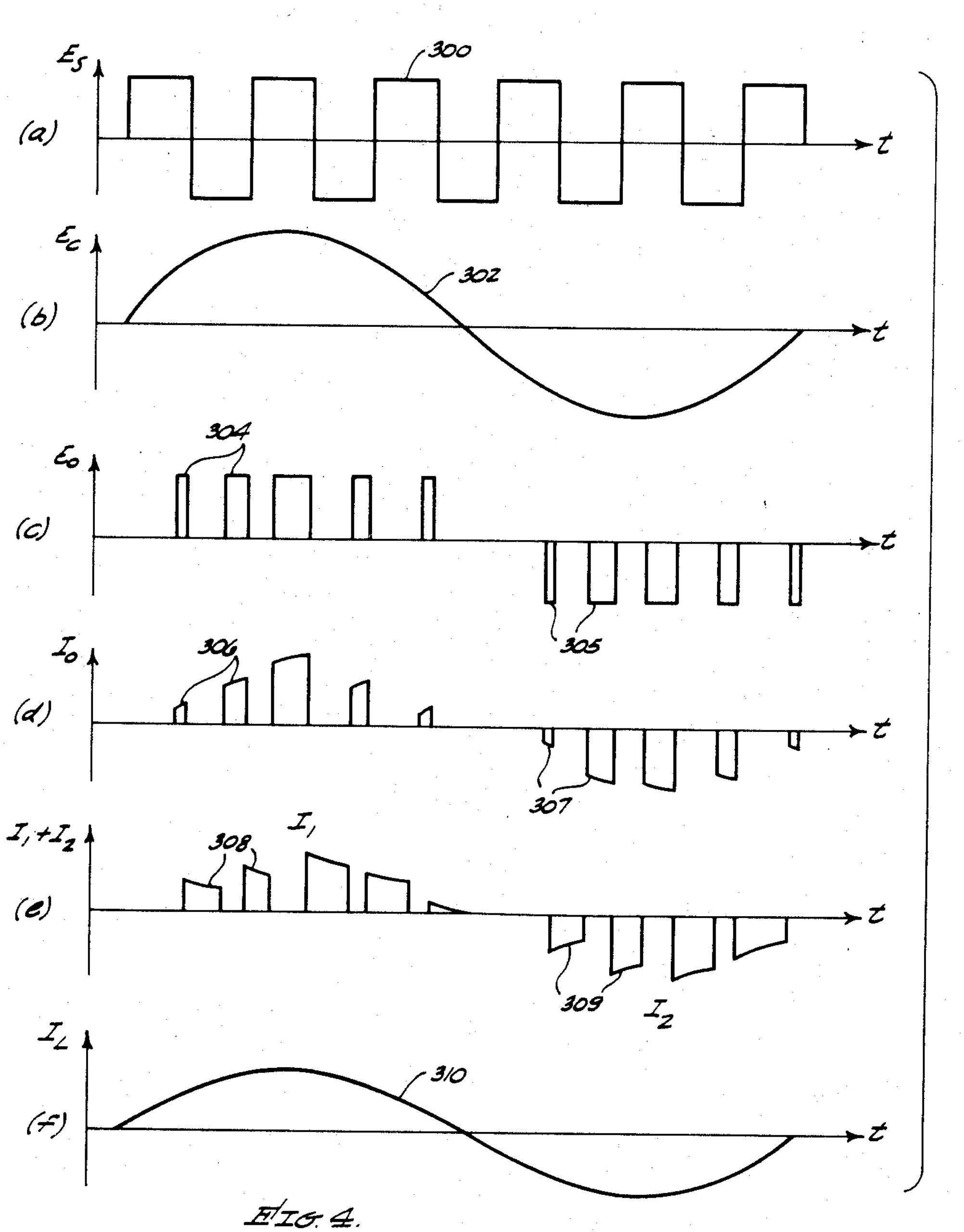

The exact nature of the invention as well as other objects, advantages and characteristics features thereof will be readily apparent from consideration of the following description of preferred embodiments of the invention taken in conjunction with the accompanying drawings in which:

FIG. 1 is a diagram, partly in block form and partly in schematic circuit form, illustrating a system employing a commutating filter provided in accordance with the principles of the present invention;

FIGS. 2(*a*)–(*f*) are graphs illustrating waveforms at various points in the system of FIG. 1 for a constant control voltage of one polarity;

FIGS. 3(*a*)–(*f*) are graphs illustrating waveforms at various points in the system of FIG. 1 for a constant control voltage of opposite polarity; and FIGS. 4(*a*)–(*f*) are graphs illustrating waveforms at various points in the system of FIG. 1 for an alternating control voltage.

Referring now to the drawings with more particularity, in FIG. 1 there is shown a system employing a commutating filter according to the present invention which is energized by a square wave generator 10. The generator 10 may comprise a relaxation oscillator, or it may include a D.C.-to-A.C. static inverter fed from a D.C. supply. It is pointed out that the generator 10 could alternately provide a sinusoidal waveform, although a square waveform is preferred since it achieves maximum power efficiency. The square wave generator 10 provides a voltage $E_s$ between its output terminals 12 and 14, the latter of which may be connected to a level of reference potential indicated as ground in FIG. 1.

The output from the square wave generator 10 is applied to a conventional pulse width modulator 16 which may include amplifying and rectifying circuitry. Although the modulator 16 may consist of magnetic amplifiers, transistors or silicon controlled rectifiers, silicon controlled rectifiers are preferred since they are most compatible with the actual filtering circuitry of the present invention from a standpoint of maximizing efficiency and reliability, while minimizing the size of the overall system. The pulse width modulator 16 functions to modulate the square wave carrier from the generator 10 in accordance with a low power control voltage $E_c$ applied between a control terminal 18 and ground, preferably after rectifying the square wave. The control voltage $E_c$ may be either a reversible polarity direct voltage or a relatively low frequency alternating voltage having, for example, a sinusoidal waveform. The output voltage $E_0$ and current $I_0$ from the pulse width modulator 16 are provided between a pair of terminals 20 and 22, the latter of which may be grounded.

The actual filtering circuitry provided by the present invention is shown enclosed within the dashed lines 24, with the input to the filter 24 being applied between the terminals 20 and 22. The filtered output signals are provided across a pair of output terminals 26 and 28 to which there may be connected an inductive load 30. The load 30, represented as a simple inductance for illustrative purposes, may be energizing windings of either a reversible D.C. or an A.C. shunt motor, with the filtered output current which flows through the load 30 being designated as $I_L$.

The commutating filter 24 comprises a pair of unidirectional filter arrangements 31 and 32 connected in parallel and in opposite sense between first and second conductors 33 and 34. The first conductor 33 is connected between input terminal 20 and output terminal 26, while the second conductor 34 interconnects input terminal 22 and output terminal 28. Each filter arrangement is operative for a different polarity input signal and includes a resistor, a low current rectifying diode, a miniature pulse transformer and a controlled rectifier. More specifically, in the filtering arrangement 31 a resistor 36 is connected between the lead 33 and one end of primary winding 40 of a miniature pulse transformer 38. The other end of the primary winding 40 is connected to the anode of a rectifying diode 42, the cathode of which is connected to the conductor 34. A silicon controlled rectifier 44 has its anode connected to the lead 34 and its cathode connected to a lead 46 which in turn connects with the lead 33. It is pointed out that although a silicon controlled rectifier is illustrated other controlled rectifiers such as a transistor operated in its switching mode, i.e. being either conductive or non-conductive, may be employed instead. The gate electrode of the silicon controlled rectifier 44 is connected to one end of secondary winding 48 of the transformer 38, the other end of the secondary winding 48 being connected to the cathode of the silicon controlled rectifier 44. The current flowing through the silicon controlled rectifier 44 between the leads 34 and 33 is designated by $I_1$, and the phase relationship between signals in the primary 40 and secondary 48 of the transformer 38 is indicated in the conventional manner by the dots adjacent to the transformer windings.

The filtering arrangement 32 is similar to the network 31 and comprises a resistor 56, primary winding 60 of a miniature pulse transformer 58, and a rectifying diode 62 connected in series between the leads 34 and 33, the cathode of the diode 62 being connected to the lead 33. Secondary winding 68 of the transformer 58 is connected between the gate electrode of a silicon controlled rectifier 64 and a lead 66 connected between the cathode of the silicon controlled rectifier 64 and the conductor 34. The anode of the silicon controlled rectifier 64 is connected to the lead 33. The current which flows through the silicon controlled rectifier 64 in the indicated reference direction is designated by $I_2$.

The operation of the commutating filter of the present invention will now be discussed, with reference to the waveforms shown in FIG. 2, for a positive D.C. control voltage $E_c$. In FIG. 2(*a*) the waveform 100 designates the square wave output $E_s$ from the generator 10, while in FIG. 2(*b*) the waveform 102 depicts the D.C. control voltage $E_c$ which may be seen to have a magnitude A. The pulse width modulator 16 rectifies the square wave 100 in accordance with the polarity of the control voltage $E_c$ and provides a series of positive pulses 104, FIG. 2(*c*), of the same amplitude and of a pulse width determined by the magnitude A of the control voltage $E_c$. During the presence of each voltage pulse 104 across the terminals 20 and 22, a current pulse 106, FIG. 2(*d*), is applied to the lead 33, and load current $I_L$ flows through the inductive load 30. Since during the occurrence of the pulses 104 the lead 33 is positive with respect to the lead 34, a small current flows through the path consisting of the resistor 36, the primary coil 40, and the diode 42. The increase in current through the primary 40 of the transformer 38 induces a voltage in the secondary 48 which biases the gate electrode of the silicon controlled rectifier 44 negatively with respect to its cathode, placing the rectifier 44 in a blocking state. Current does not flow through the primary winding 60 of the transformer 58 due to the reverse bias applied across the diode 62, and therefore, since no voltage is induced on the gate electrode of the silicon controlled rectifier 64, the rectifier 64 is also in a blocking condition. Furthermore, during this period, due to the inductance of the load 30, the load current $I_L$ which is supplied from the modulator 16 increases slowly as shown by the curve portion 106' of FIG. 2(*f*).

At the termination of the pulses 104 the conductors 33 and 34 are returned to the same potential, and current ceases to flow through the primary winding 40 of the transformer 38. The decrease (negative rate of change) in current through the primary 40 induces a voltage in the secondary 48 which renders the gate electrode of the silicon controlled rectifier 44 positive with respect to its cathode. Moreover, with the cessation of the input current $I_0$, the load current $I_L$ starts to decrease, and the induced voltage resulting from the negative rate of change of current through the inductive load 30 biases the anode of the silicon controlled rectifier 44 positively with respect to the cathode. A current $I_1$ flows through the silicon controlled rectifier 44 from the lead 34 to the lead 33, and since the input current $I_0$ is now zero, the load current $I_L$ is equal to the current $I_1$. During this period, the load current $I_L$, which is sustained in its original direction by the silicon controlled rectifier current $I_1$, decreases at a rate determined by the load time constant. The periods during which the silicon controlled rectifier 44 is conductive of current $I_1$ are designated by the current pulses 108 of FIG. 2(*e*), with the load current $I_L$ supplied during these intervals being indicated by the curve portions 108' of FIG. 2(*f*). Since the time constant of the inductive load 30 is long compared to the repetition period of the pulses 104, the alternating component of the load current $I_L$ is small relative to the direct component, and an essentially constant current is maintained through the load 30.

It should be noted that during the intervals when the silicon controlled rectifier 44 is conductive, the silicon controlled rectifier 64 remains in its blocking state on account of the positive bias applied between its cathode and anode and because of the negative bias applied to its gate. This gate bias results from the voltage induced in the secondary winding 68 of the transformer 58 by a slight positive rate of change of current through the primary 60 at this time.

In the operation of the commutating filter 24 for a negative D.C. control voltage $E_c$, now to be discussed with reference to the waveforms of FIG. 3, the silicon controlled rectifier 64 of the filtering network 32 becomes conductive while the silicon controlled rectifier 44 of the arrangement 31 is maintained blocked. The square wave input voltage $E_s$ to the pulse width modulator 16 is shown by the waveform 200 of FIG. 3(*a*), while the control voltage $E_c$ applied to the terminal 18 of the pulse width modulator 16 is illustrated by the waveform 202 of FIG. 3(*b*). It may be seen that the D.C. voltage 202 is of negative polarity and has a magnitude B which is greater than the magnitude A of the voltage 102 of FIG. 2(*b*). Therefore, the output pulses 204, FIG. 3(*c*), from the modulator 16 are negative and have a greater pulse width than the pulses 104 of FIG. 2(*c*), although the same amplitude as the pulses 104.

During the occurrence of the pulses 204 the diode 62 is conductive due to the positive bias between the leads 34 and 33, and current flows through the primary 60 of the transformer 58. The gate of the silicon control rectifier 64 is biased negatively with respect to its cathode, thereby preventing current flow through the rectifier 64 at this time. In addition, neither the diode 42 nor the silicon controlled rectifier 44 is conductive during this interval. However, load current $I_L$ which flows in a negative direction is sustained at this time by the negative current pulses 206, FIG. 3(*d*), supplied from the pulse width modulator 16. These portions of the load current waveform corresponding to the pulses 206 are designated by 206' in FIG. 3(*f*).

During the intervals between the pulses 204, the positive rate of change (decrease in magnitude of negatively flowing current) of the load current $I_L$ induces a voltage which biases the anode of the silicon controlled rectifier 64 positively with respect to its cathode. Since the gate of the silicon controlled rectifier 64 is now positive with respect to the cathode on account of the decrease in current through the primary 60 the transformer 58, current $I_2$ will flow through the silicon controlled rectifier 64 from its anode to its cathode, i.e. in a direction opposite to the reference direction for $I_2$. This current is shown by the pulses 208 of FIG. 3(*e*). The silicon controlled rectifier 44 remains blocked at this time because of the positive voltage induced between its cathode and anode, as well as on account of the negative bias applied to its gate due to any slight current which flows through the primary 40 of the transformer 38. During the occurrence of the pulses 208 current flows through the silicon controlled rectifier 64 and through the load 30 in the negative direction to maintain the load current $I_L$, as is illustrated by the portions 208' of the waveform of FIG. 3(*f*). Thus, for a negative D.C. control signal, an essentially constant current in the negative direction is maintained through the load 30.

As has been pointed out above, the modulating control voltage $E_c$ may be a low frequency alternating voltage. For example, for a square wave carrier $E_s$ at a frequency of 2 kc., the modulating signal $E_c$ may be a 60 or 400 cycle sine wave. Waveforms illustrating operation with an alternating control signal are given in FIG. 4. The square wave carrier $E_s$ is shown by the waveform 300 of FIG. 4(*a*), while the low frequency alternating control voltage $E_c$ is illustrated by the sine wave 302 of FIG. 4(*b*). As may be seen from FIG. 4(*c*), the output voltage $E_0$ from the pulse width modulator 16 consists of a first series of pulses 304 of positive polarity resulting from the positive portion of the control waveform 302 and having a pulse width dependent upon the instantaneous amplitude of the control waveform 302, and a second series of negative polarity pulses 305 occurring during the negative portion of the control signal 302 also having a pulse width determined by the instantaneous amplitude of the control voltage. The current $I_0$ into the filter 24 consists of positive current pulses 306 and negative current pulses 307, FIG. 4(*d*), which vary in amplitude in accordance with the instantaneous value of the alternating control signal $E_c$ and which have pulse widths corresponding to those of the voltage pulses 304 and 305, respectively. During the presence and absence of the pulses 304 and 305 the various elements of the filter 24 operate in the same manner as discussed above for the presence and absence of the pulses 104 and 204. As is illustrated in FIG. 4(*e*), during the intervals between the pulses 304 current $I_1$ flows through the silicon controlled rectifier 44 in the positive direction. This current takes the form of pulses 308 which vary in amplitude in accordance with the instantaneous amplitude of the waveform 302. Similarly, during the intervals between the negative pulses 305 current pulses 309 of varying amplitude flow through the silicon controlled rectifier 64 in the negative $I_2$ direction. Since the load current $I_L$ is the sum of the currents $I_0$, $I_1$, and $I_2$, it may be seen, FIG. 4(*f*), that a waveform 310 for the load current $I_L$ results which approximates that of the sinusoidal control voltage $E_c$. In this mode of operation the present invention makes feasible a highly efficient D.C.-to-A.C. inverter of small size and weight, since transformation and filtering is performed at high frequency (2 kc.), eliminating the need for power frequency (60 or 400 cycle) transformers and chokes.

It is pointed out that by applying the control voltage $E_c$ into the pulse width modulator 16, rather than directly to the motor energizing windings, the output impedance of the stage furnishing the control signal may be made such that a very small power dissipation occurs. In addition, since very small currents flow through the silicon controlled rectifiers 44 and 64 for a relatively small fraction of the time during which the system is operated, there is little power dissipation in the filter 24. Thus, the system of the present invention is able to operate with an extremely high efficiency, i.e., the ratio of output power to input power. For example, whereas prior art motor control systems have operated at efficiencies of around 67%, the system of the present invention provides an efficiency in excess of 90%.

As a further example of the improvement made possible by the filter of the present invention, a control system output stage supplying a maximum of 1000 watts into a reversible shunt motor has dissipated 250 watts at half power output with prior art control and filter circuitry, while a circuit employing the filter 24 of the present invention has been built with a power dissipation of less than 25 watts.

Moreover, whereas in the prior art optimum filters for inductive loads have required the employment of a capacitance tuned to the inductance of the load (necessitating different filters for different loads on the same amplifier), the filter of the present invention does not require capacitors which must be tuned to the load, making the filter independent of the load and allowing the same filter to be used throughout a wide range of load inductance values.

Although the present invention has been shown and described with reference to specific embodiments, nevertheless, various changes and modifications obvious to one skilled in the art to which the invention pertains are deemed to be within the purview of the invention.

What is claimed is:

1. A filter circuit for providing current to an inductive load comprising: a pair of terminals for coupling to said inductive load; a transformer having a primary winding and a secondary winding; a rectifier coupled in series with said primary winding between said terminals; and a controlled rectifier having a first electrode, a second electrode, and a control electrode; each of said first and second electrodes being coupled respectively to one of said pair of terminals; and said control electrode being coupled to said secondary winding.

2. A filter circuit for providing current to an inductive load comprising: a transformer having a primary winding and a secondary winding, a diode coupled in series with said primary winding to form a unidirectional current path in parallel with said load, and a silicon controlled rectifier having an anode-cathode current path and a gate electrode, said anode-cathode path being coupled in parallel with said load and in opposite unidirectional conductivity to that of said diode, and said gate electrode being coupled to said secondary winding.

3. A filter circuit for providing current to an inductive load coupled between a pair of terminals comprising: a transformer having a primary winding and a secondary winding; a diode; said diode and said primary winding being coupled in series between said pair of terminals; and a silicon controlled rectifier having a first electrode, a second electrode, and a gate electrode; each of said first and second electrodes being coupled respectively to one of said pair of terminals; and said secondary winding of said transformer being coupled between said first and said gate electrodes.

4. A filter circuit for providing current to an inductive load connected between first and second terminals comprising: a transformer having a primary winding and a secondary winding; a diode having an anode and a cathode; a resistor; said resistor, said primary winding, and said diode being connected in series between said first and second terminals with said cathode of said diode facing said second terminal; and a silicon controlled rectifier having an anode, a cathode, and a gate electrode; said anode of said silicon controlled rectifier being connected to said second terminal; said cathode of said silicon controlled rectifier being connected to said first terminal; and said secondary winding being connected between said gate electrode and said cathode of said silicon controlled rectifier.

5. A commutating filter circuit for providing current to an inductive load comprising: first and second terminals for coupling to said inductive load; first and second transformers each having a primary winding and a secondary winding; a first rectifier coupled in series with said primary winding of said first transformer to form a first unidirectional current path between said first and second terminals; a second rectifier coupled in series with said primary winding of said second transformer to form a second unidirectional current path between said first and second terminals in a direction opposite that of said first unidirectional path; and first and second controlled rectifiers each having a first electrode, a second electrode, and a control electrode; said first and second electrodes of said first controlled rectifier being coupled respectively to said first and second terminals; said first and second electrodes of said second controlled rectifier being coupled respectively to said second and first terminals; said control electrode of said first controlled rectifier being coupled to said secondary winding of said first transformer; and said control electrode of said second controlled rectifier being coupled to said secondary winding of said second transformer.

6. A commutating filter for providing current to an inductive load comprising: first and second transformers each having a primary winding and a secondary winding, a first diode coupled in series with said primary winding of said first transformer to form a first unidirectional current path in parallel with said load, a second diode coupled in series with said primary winding of said second transformer to form a second unidirectional current path in parallel with said load in a direction opposite that of said first unidirectional path, first and second silicon controlled rectifiers each having an anode-cathode current path and a gate electrode, said anode-cathode path of said first silicon controlled rectifier being coupled in parallel with said load and in opposite unidirectional conductivity to that of said first diode, said anode-cathode path of said second silicon controlled rectifier being coupled in parallel with said load and in opposite unidirectional conductivity to that of said second diode, said gate electrode of said first silicon controlled rectifier being coupled to said secondary winding of said first transformer, and said gate electrode of said second silicon controlled rectifier being coupled to said secondary winding of said second transformer.

7. A commutating filter circuit for providing current to an inductive load coupled between first and second terminals comprising: first and second transformers each having a primary winding and a secondary winding; first and second diodes; said first diode and said primary winding of said first transformer being coupled in series between said first and second terminals; said second diode and said primary winding of said second transformer being coupled in series between said first and second terminals with said second diode being coupled in opposite polarity to that of said first diode; first and second silicon controlled rectifiers each having a first electrode, a second electrode, and a gate electrode; said first and second electrodes of said first silicon controlled rectifier being coupled respectively to said first and second terminals; said first and second electrodes of said second silicon controlled rectifier being coupled respectively to said second and first terminals; said secondary winding of said first transformer being coupled between said first and said gate electrodes of said first silicon controlled rectifier; and said secondary winding of said second transformer being coupled between said first and said gate electrodes of said second silicon controlled rectifier.

8. A commutating filter circuit for providing current to an inductive load connected between first and second terminals comprising: first and second transformers each having a primary winding and a secondary winding; first and second diodes each having an anode and a cathode; first and second resistors; said first resistor, said primary winding of said first transformer, and said first diode being connected in series between said first and second terminals with said cathode of said first diode facing said second terminal; said second resistor, said primary winding of said second transformer, and said second diode being connected in series between said first and second terminals with the cathode of said second diode facing said first terminal; first and second silicon controlled rectifiers each having an anode, a cathode, and a gate electrode; said anode of said first silicon controlled rectifier being connected to said second terminal; said cathode of said first silicon controlled rectifier being connected to said first terminal; said cathode of said second silicon controlled rectifier being connected to said second terminal; said anode of said second silicon controlled rectifier being connected to said first terminal; said secondary winding of said first transformer being connected between said gate electrode and said cathode of said first silicon controlled rectifier; and said secondary winding of said second transformer being connected between said gate electrode and said cathode of said second silicon controlled rectifier.

9. A circuit comprising: source means for supplying a series of unidirectional pulses of essentially constant amplitude and a variable duration between a pair of terminals, a transformer having a primary winding and a secondary winding, a rectifier coupled in series with said primary winding between said terminals, a controlled rectifier having a current path and a control electrode, with said current path coupled between said terminals and said control electrode coupled to said secondary winding, and an inductive element coupled in parallel with said current path.

10. A circuit according to claim 9 wherein said source means includes a pulse width modulator for modulating a carrier signal in accordance with a direct control voltage.

11. A circuit comprising: source means for supplying a series of reversible polarity pulses of essentially constant amplitude and variable duration between first and second terminals; first and second transformers each having a primary winding and a secondary winding; a first rectifier coupled in series with said primary winding of said first transformer to form a first unidirectional current path between said first and second terminals; a second rectifier coupled in series with said primary winding of said second transformer to form a second unidirectional current path between said first and second terminals in a direction opposite that of said first unidirectional path, first and second controlled rectifiers each having a first electrode, a second electrode, and a control electrode; said first and second electrodes of said first controlled rectifier being coupled respectively to said first and second terminals; said first and second electrodes of said second controlled rectifier being coupled respectively to said second and first terminals; said control electrode of said first controlled rectifier being coupled to said secondary winding of said first transformer; said control electrode of said second controlled rectifier being coupled to said secondary winding of said second transformer; and an inductive element coupled between said first and second terminals.

12. A circuit according to claim 11 wherein said source means includes a pulse width modulator for modulating a carrier signal in accordance with a reversible polarity direct control voltage.

13. A circuit according to claim 11 wherein said source means includes a pulse width modulator for modulating a relatively high frequency carrier signal in accordance with an alternating signal of relatively low frequency, whereby the duration of said reversible polarity pulses is determined by the instantaneous amplitude of said alternating signal and the polarity of said pulses is determined by the instantaneous polarity of said alternating signal.

14. A control circuit for a direct current controlled shunt motor having a reversible direction of rotation comprising: means for rectifying and modulating a square wave carrier signal in accordance with a direct voltage of a polarity determinative of the direction of rotation of said motor to produce a series of pulses of a duration determined by the magnitude of said direct voltage and of a polarity determined by the polarity of said direct voltage; commutating filter means having first and second terminals coupled to said rectifying and modulating means; said filter means comprising first and second transformers each having a primary winding and a secondary winding, a first rectifier coupled in series with said primary winding of said first transformer to form a first unidirectional current path between said first and second terminals, a second rectifier coupled in series with said primary winding of said second transformer to form a second unidirectional current path between said first and second terminals in a direction opposite that of said first unidirectional path, and first and second controlled rectifiers each having a unidirectional current path and a control electrode, the current paths of said first and second controlled rectifiers being coupled between said first and second terminals in opposite unidirectional conductives, the control electrode of said first controlled rectifier being coupled to said secondary winding of said first transformer, the control electrode of said second controlled rectifier being coupled to said secondary winding of said second transformer; and the energizing windings of said motor being coupled in parallel between said first and second terminals of said filter means.

15. A control circuit for an alternating current controlled shunt motor comprising: means for rectifying and modulating a square wave carrier signal of relatively high frequency in accordance with an alternating control signal of relatively low frequency to produce a series of pulses of a duration determined by the instantaneous amplitude of said alternating control signal and of a polarity determined by the instantaneous polarity of said alternating control signal; commutating filter means having first and second terminals coupled to said rectifying and modulating means; said filter means comprising first and second transformers each having a primary winding and a secondary winding, a first rectifier coupled in series with said primary winding of said first transformer to form a first unidirectional current path between said first and second terminals, a second rectifier coupled in series with said primary winding of said second transformer to form a second unidirectional current path between said first and second terminals in a direction opposite that of said first unidirectional path, and first and second controlled rectifiers each having a unidirectional current path and a control electrode, the current paths of said first and second controlled rectifiers being coupled between said first and second terminals in opposite unidirectional conductivities, the control electrode of said first controlled rectifier being coupled to said secondary winding of said first transformer, the control electrode of said second controlled rectifier being coupled to said secondary winding of said second transformer; and the energizing windings of said motor being coupled in parallel between said first and second terminals of said filter means.

No references cited.